US005952678A

United States Patent [19]
Ashida

[11] Patent Number: 5,952,678
[45] Date of Patent: *Sep. 14, 1999

[54] SRAM CELL WITH NO PN JUNCTION BETWEEN DRIVER AND LOAD TRANSISTORS AND METHOD OF MANUFACTURING THE SAME

[75] Inventor: Motoi Ashida, Itami, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/821,144

[22] Filed: Mar. 20, 1997

Related U.S. Application Data

[62] Division of application No. 08/511,820, Aug. 7, 1995, Pat. No. 5,635,731.

[30] Foreign Application Priority Data

Jan. 23, 1995 [JP] Japan ............................... P07-008162

[51] Int. Cl.[6] ............................................. H01L 29/76

[52] U.S. Cl. ............................ 257/67; 257/393; 257/756; 257/903

[58] Field of Search ................................ 257/67, 69, 368, 257/369, 377, 384, 755, 756, 903, 904, 393

[56] References Cited

U.S. PATENT DOCUMENTS

| | | | |
|---|---|---|---|
| 5,331,170 | 7/1994 | Hayashi | 257/377 |
| 5,592,011 | 1/1997 | Yang | 257/368 |
| 5,635,731 | 6/1997 | Ashida | 257/67 |

FOREIGN PATENT DOCUMENTS

| | | | |
|---|---|---|---|
| 4-290467 | 10/1992 | Japan | 257/72 |
| 5-109988 | 4/1993 | Japan | 257/72 |

*Primary Examiner*—Minh Loan Tran
*Attorney, Agent, or Firm*—McDermott, Will & Emery

[57] ABSTRACT

SRAM memory cells is provided with high resistance to soft error and no parasitic capacitance due to PN junction. SRAM memory cells comprises the load resister is a thin film transistor having a same conductive type as that of the driver transistor.

3 Claims, 14 Drawing Sheets

16 15 17 11 13 12 10 9 12 13 8 8 6 7 4 1 2 5 3 4 100

SRAM CELL WITH NO PN JUNCTION BETWEEN DRIVER AND LOAD TRANSISTORS AND METHOD OF MANUFACTURING THE SAME

This application is a division of application Ser. No. 08/511,820 filed Aug. 7, 1995, now U.S. Pat. No. 5,635,731.

BACKGROUND OF THE INVENTION

1. Field of the Invention

The present invention relates to SRAM or a semiconductor device provided with SRAM, especially to SRAM memory cell construction and a method for manufacturing the same.

2. Description of Related Art

Recently, high integration of semiconductor device is going to be advanced, so there is coming same trend to do in the SRAM technology. The most effective influence on the integration of SRAM is reduction area of a memory cell, so that it is thought that manufacturing technology may be the key to realize the high integration.

Therefore, in a SRAM memory cell comprising a pair of cross-coupled invertor, there has been used a three-dimensional construction wherein a load part is laminatedly formed on a balk transistor. As the load part, there are proposed two types, one is a polysilicon high resistor type and the other is a P-ch thin film transistor(TFT) type.

In the latter case, as shown in FIG. 18, which is an equivalent circuit view of a CMOS type SRAM, wherein the load part is a P-ch TFT and the balk part is a N-ch FET. That is, the SRAM memory cell generally comprises four N-ch transistors for the balk part, two of them being driver transistors N1, N2 and the other two access transistors N3, N4, while it comprises two load P-ch transistors P, P2 for the load part, and further bit lines and word lines for read/write the data and a source for providing voltage Vcc. Each one of the driver transistors N1, N2 and the load transistors P1, P2, for example the transistors P1 and N1 combine to constitute an Invertor circuit (NOT circuit) and a pair of the Invertor circuits combine to constitute Flip-Flop circuit, wherein either one of the two invertor circuits can keep On-state to act as a memory and also when either one of P-ch transistor and N-ch transistor of each invertor circuit is On-state, the other is OFF-state, so that CMOS FET cells use little power and are used in large memories.

However, the conventional two type load ones have the following problems.

In the case of P-ch transistor load type, connection between the N-ch driver transistor and the P-ch load transistor makes PN junctions which have parasitic capacitance generated as shown FIG. 24, resulting in voltage drop which causes to prevent from depressing lower limit hold voltage and lower limit operating voltage (Vcc Low). On the other hand, in the case of polysilicon high resistor type, it is difficult to form a thin layer of polysilicon so that high resistivity of more than several T ($10^{12}$)Ω is hardly obtained and the capacitance between nodes becomes smaller due to pattern layout, resulting in lower resistance to soft error.

SUMMARY OF THE INVENTION

Accordingly, an essential object of the present invention is to provide SRAM memory cells having high resistance to soft error and no PN junction between the driver transistor and the load transistor.

Another object of the present invention is to provide a method for manufacturing the SRAM memory cells having high resistance to soft error and no parasitic capacitance due to PN junction between the driver transistor and the load transistor.

In accomplishing these objects, as a result of much sharp research, the inventor has found that use of the load transistor having a same conductive type as that of the driver transistor can make the problem in the conventional type SRAM memory cells to be solved completely.

According to a first aspect of the present invention, there is provided SRAM memory cells provided with a balk transistor part comprising access transistors and diver transistors and a load part, wherein the load part is a thin film transistor and has a same conductive type as that of the balk transistor. Therefore, a first embodiment of the present invention has N-ch balk transistors, so that the load transistor is a N-ch transistor. On the other hand, a second embodiment of the present invention has P-ch transistors, so that the load transistor is a P-ch transistor.

Generally, said balk transistor part comprises four N-ch or P-ch transistors which are two pairs of an access transistor and a driver transistor. In the preferred embodiment, the load part comprises a first load transistor and a second load transistor each of which channels are formed on a corresponding driver transistor to have a capacity C between the first and the second load transistor.

In the present invention, since the load transistor is a same conductive type as that of the driver transistor, if SRAM memory cells should be a low power consumption type, a threshold voltage Vth of the load transistor is set to have a large value than an absolute value of a source voltage Vcc so that the load transistor act as super high resistance, resulting in that the load transistor in the SRAM memory cell is always in OFF-state (that is, becomes normally OFF circuit) and current flow in the SRAM memory cell can be depressed.

In order to make the threshold voltage Vth of the load transistor larger than an absolute value of a source voltage Vcc SRAM memory cells, in the case that the load transistor is a N-channel type thin film transistor, the P type dopant is implanted or diffused from a laminated layer containing the dopant into the channel part thereof. On the other hand, in the case that the load transistor is a P-channel type thin film transistor, the N type dopant is implanted (driven) or diffused by means of a well-known method. Ion implantation method is preferred than Ion diffusion method. In the ion implantation method, $BF_2$ may be used as the P type dopant. The $BF_2$ implantation technology may be applied to the P-ch load transistor of the conventional CMOS memory cell.

Accordingly, the present invention is also to provide SRAM memory cells provided with a balk transistor part comprising access transistors and diver transistors and a load part, wherein the load part is a thin film transistor and has a N-channel type into which channel part the P type dopant is driven by $BF_2$.

Further, according to a second aspect of the present invention, there is provided a method for manufacturing SRAM memory cells such as stated above in the first and second embodiments provided with a balk transistor part comprising access transistors and diver transistors and a load part, wherein the load part is a thin film transistor and the thin film transistor and the balk transistors are same conductive type, which comprises steps of:

forming a second conductive type transistor for act as the balk transistor on a first conductive type substrate, forming a second conductive type thin film transistor for the load transistor on the second conductive transistor.

In applying the method according to the present invention to a bottom gate type, the step of forming a second conductive thin film transistor is carried out by forming the top layer of the second conductive type channel part after formation of gate electrodes.

In an embodiment of the present method invention, a threshold voltage Vth of the load transistor is set to have a large value than an absolute value of a source voltage Vcc by the ion implantation process or the diffusion process. In a preferred embodiment, a step of driving the P dopant into the channel part of the thin film transistor may be carried out by means of $BF_2$ implantation method to set the threshold voltage Vth of the load to a large value than an absolute value of a source voltage Vcc.

The $BF_2$ implantation technology may be applied to the P-ch load transistor of the conventional CMOS memory cell. Accordingly, the present invention is also to provide a method for manufacturing SRAM memory cells provided with a balk transistor part comprising access transistors and diver transistors and a load part comprising a thin film transistor, which comprises steps of:

- forming a second conductive type transistor for act as the balk transistor on a first conductive type substrate,
- forming a second conductive type thin film transistor for the load transistor on the second conductive transistor,
- driving $BF_2$ as the P dopant into the channel part of the thin film transistor to set the threshold voltage Vth of the load to a large value than an absolute value of a source voltage Vcc.

According to the present invention, the function of the SRAM memory cell is as follows.

As shown in FIG. 1, in the case of the balk transistor N1, N2 being N-ch TFT, the load part is constructed by the same conductive N-ch TFTs N5, N6. On the other hand, as shown in FIG. 2, in the case of the balk transistors P1, P2 being P-ch TFT, the load part is constructed by the same conductive P-ch TFTs P5, P6. Due to this arrangement, there is found no PN junction which has been found between the load transistor P1, P2 and the balk transistor P1, P2 in the conventional SRAM of FIG. 24. Thereby, the voltage drop can be prevented and the lower limit hold voltage of SRAM and the lower limit operating voltage can be lowered.

Further, while, with high integration it is a problem that a capacitance between nodes becomes smaller in relation to pattern layout and the resistance to soft error are lowered, the present invention can provide such a construction that gate parts of the load part and the balk part are arranged to overlap each other as shown in FIG. 16(*a*) and (*b*), which makes a capacity generated between the nodes as shown in FIG. 17, resulting in improved resistance to such a soft error.

Furthermore, the threshold voltage of the load transistor is designed to have a large value than the absolute value of the source voltage Vcc , so that especially in the low power consumption type SRAM, the channel of the load transistor is always settled to OFF-state or becomes normally OFF circuit as shown in FIG. 9. Therefore, the load transistor can act as ultra high resistance, which is 10 times as much as that of the conventional polysilicon high resister, resulting in depressed leak current through the load part and thus realization of low power consumption in SRAM.

The threshold voltage of the load TFT can be controlled by means of implanting the P type ion into the channel part of N-ch TFT or the N type ion into the channel part of P-ch TFT. Additionally, implantation of $BF_2$ as the P type ion into the channel of the load N-ch TFT can improve total reliance of memory cell as shown in FIG. 14 since unpaired electron of Si in the substrate can be combined and terminated.

The $BF_2$ implantation technology applied to the P-ch load transistor of the conventional CMOS memory cell can make the threshold voltage Vth changed with time depressed.

BRIEF DESCRIPTION OF THE DRAWINGS

These and other objects and features of the present invention will become apparent from the following description taken in conjunction with the preferred embodiments thereof with reference to the accompanying drawings, in which.

PREFERRED EMBODIMENT OF THE INVENTION

EXAMPLE 1

Figure 1:
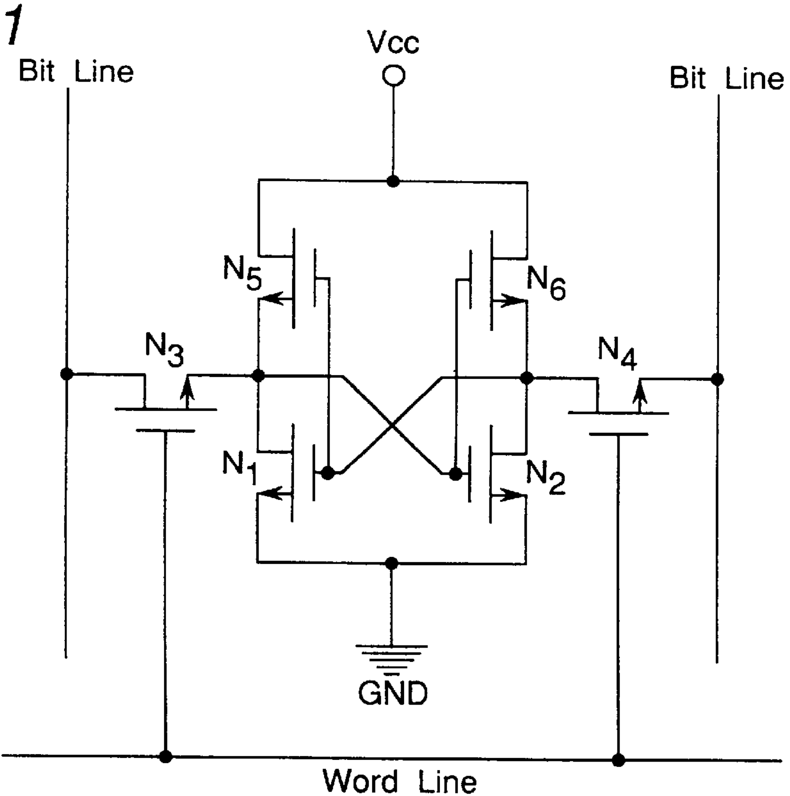
FIG. 1 is an equivalent circuit view showing SRAM memory cell provided with both of the balk and the load parts are N-ch TFT.
Figure 2:
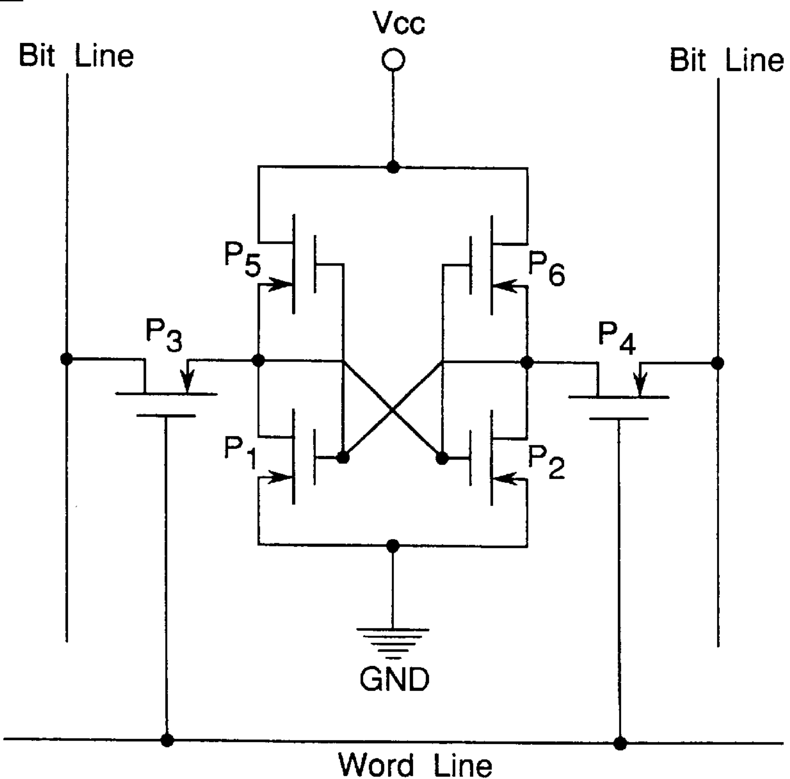
FIG. 2 is an equivalent circuit view showing SRAM memory cell provided with both of the balk and the load parts are P-ch TFT.
Figure 3:
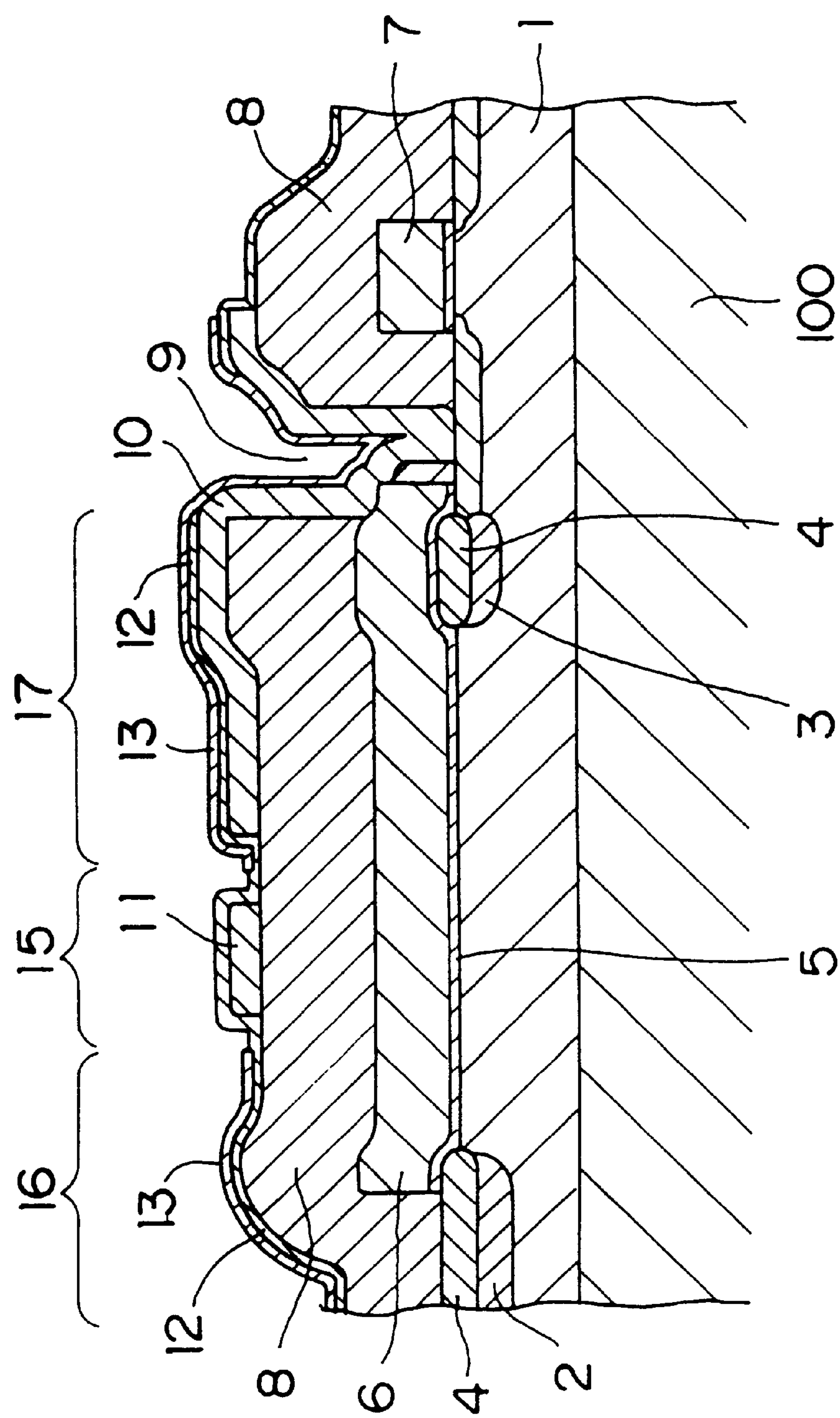
FIG. 3 is a sectional construction view of the SRAM memory cell manufactured according to the present invention.

As shown in FIG. 1, a SRAM memory cell comprises a balk part and a load part. The balk part comprises four N-ch TFT, two of them are driver transistors N1, N2 and the other two are access transistors N3, N4. On the hand, the load part comprises two N-ch TFT. The memory cell further comprises bit lines and word lines for read/write the data and also a source for providing voltage Vcc.

Figure 4:
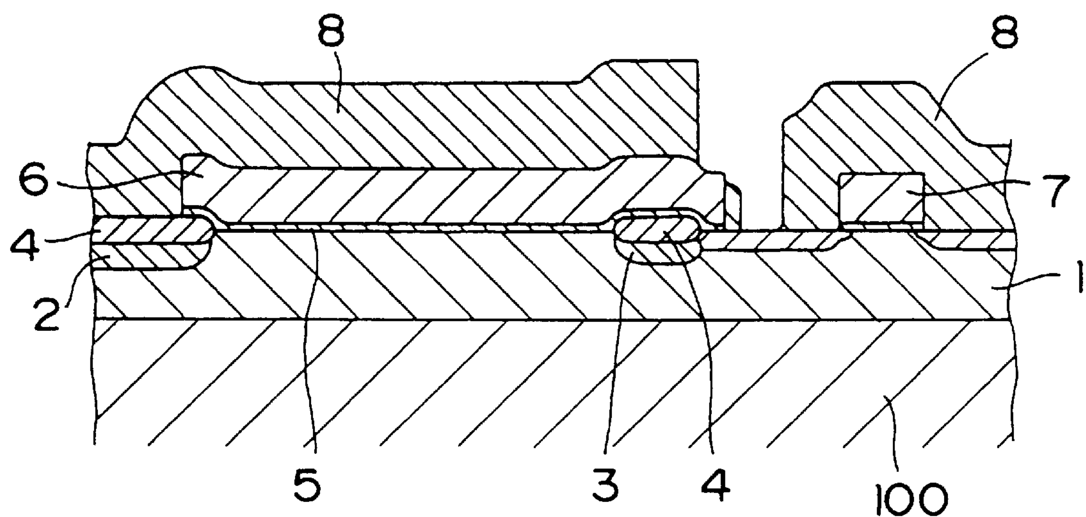
FIG. 4 is a sectional view showing one step of the invention method.

A manufacturing method according to the present invention comprises the following steps. Firstly, same as the conventional method, balk transistors are formed on a substrate as shown in FIG. 4, and thereafter on the balk transistors an insulate layer 8, for example, having a thickness of about 1000 Å, is formed. On the insulate layer, there is formed an opening corresponding to gate electrodes of the balk transistors.

Figure 5:
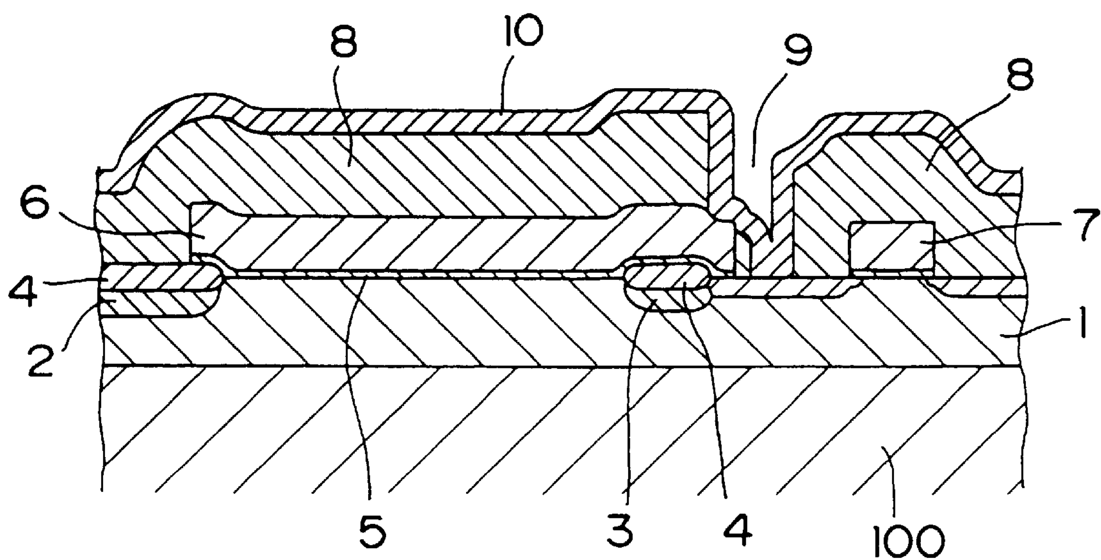
FIG. 5 is a sectional view showing one step of the invention method.
Figure 6:
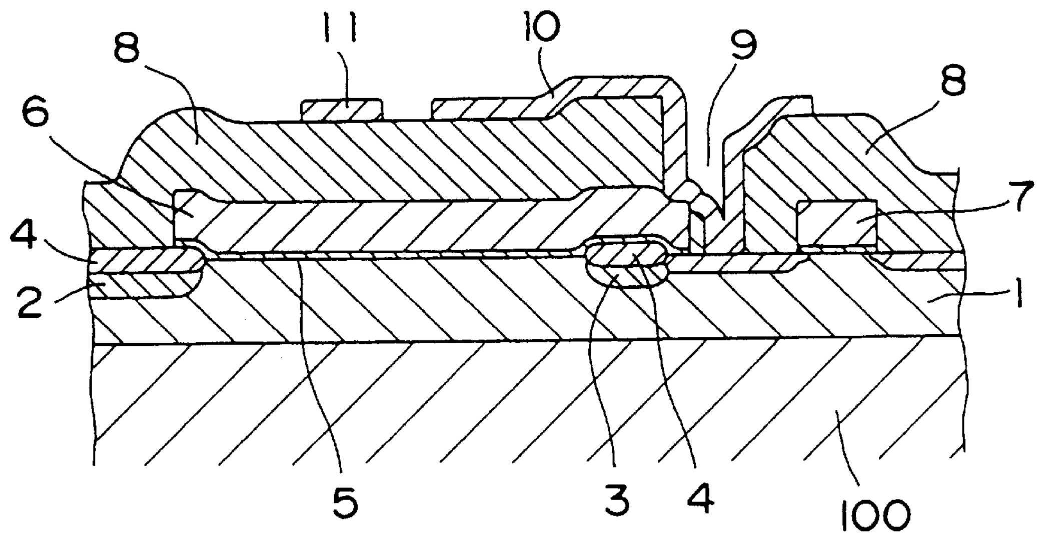
FIG. 6 is a sectional view showing one step of the invention method.
Figure 7:
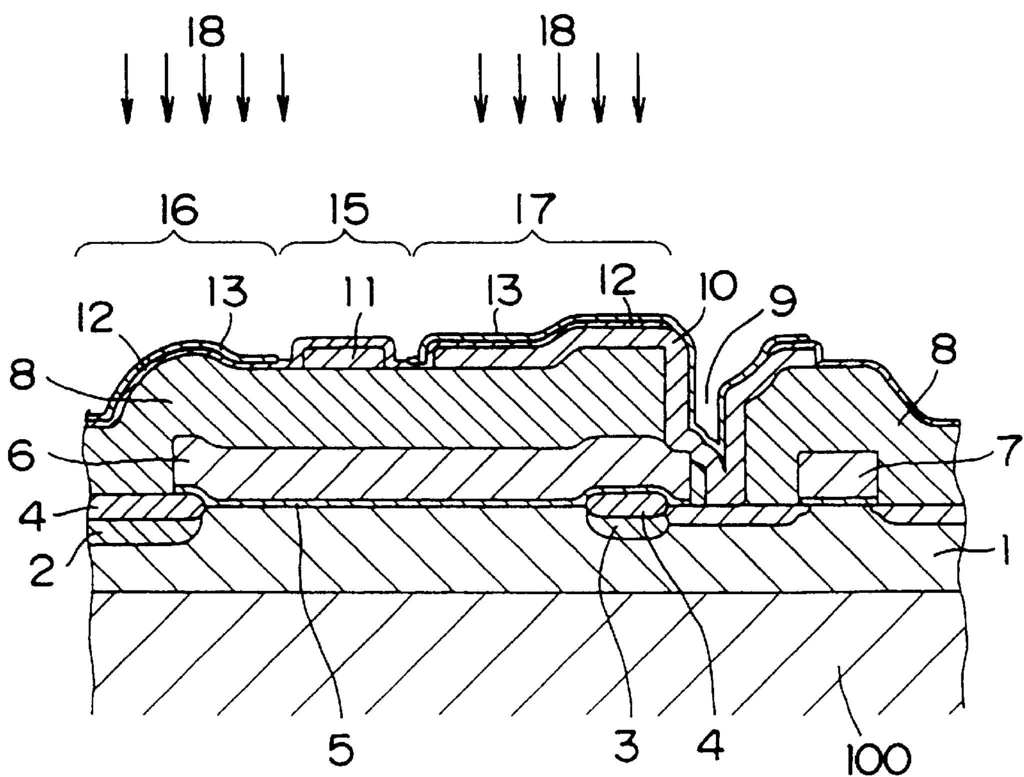
FIG. 7 is a sectional view showing one step of the invention method.

Secondly, as shown in FIG. 5, a polysilicon layer 10, for example having a thickness of 500 Å is formed to connect the lower balk transistors and the load transistors through a contact part 9 and then is subjected to a patterning treatment to form a gate electrode 11 of the load transistor as shown in FIG. 6.

Thirdly, after forming a gate oxide layer 12 having a thickness of several 100 Å, a polysilicon layer 13 having a thickness of several 100 Å is formed thereon.

Finally, after subjecting polysilicon layer 13 to a patterning treatment, the N type ion 18 is implanted into a source and a drain through a mask of photosensitive resin (not shown) to form a N type source region and a N type drain region 17 which constitute bottom gate type N-ch transistor to be the load part of the memory cell.

Figure 16B:
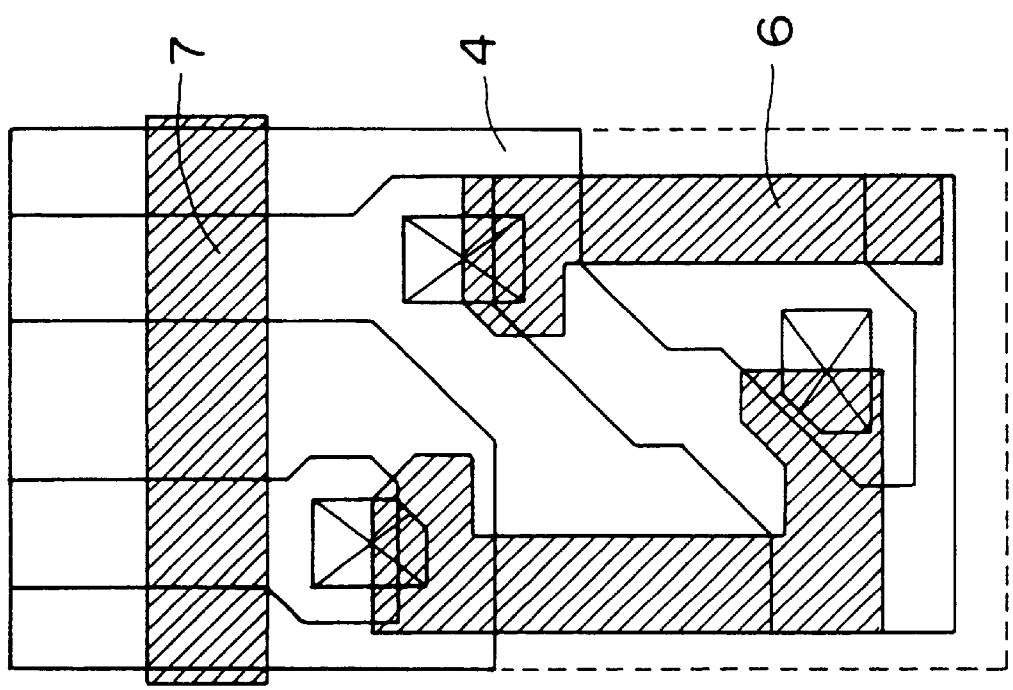
Figure 16A:
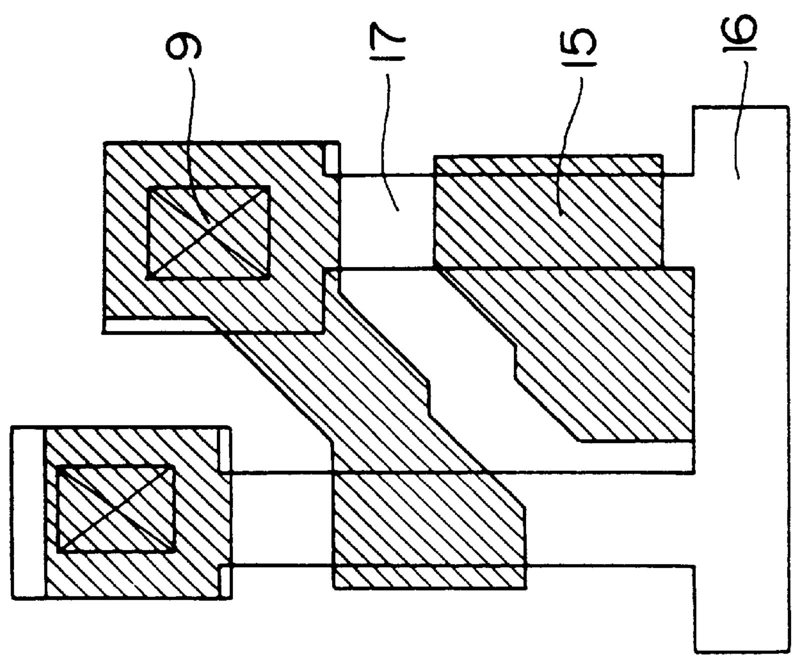
Figure 17:
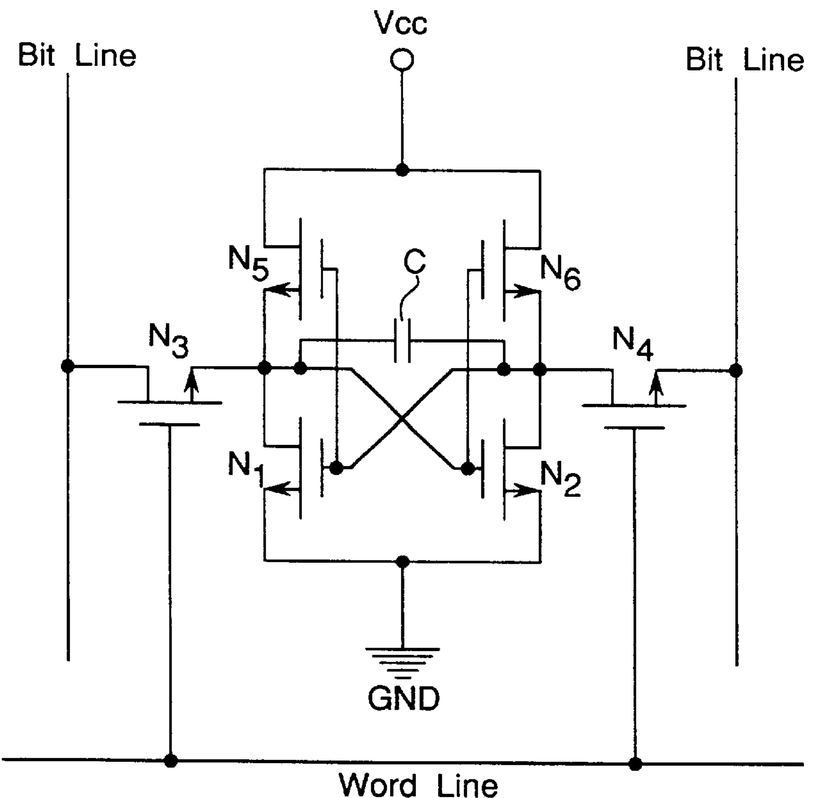
FIG. 17 is an equivalent view of SRAM memory cell according to the present invention with considering a capacitance between nodes.
Figure 18:
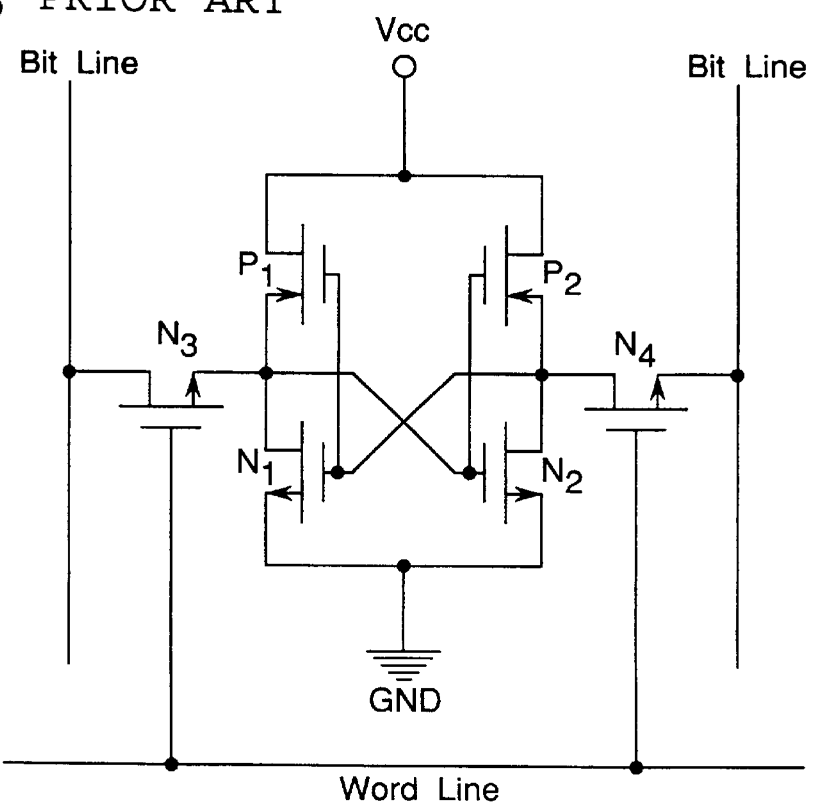
FIG. 18 is an equivalent view of the conventional SRAM memory cell.

In FIG. 16, *(a)* is a plane view showing a lower layer lamination construction of SRAM memory cell manufactured according to the present invention and (b) is a plane view showing an upper plane view of SRAM memory cell manufactured according to the present invention. As shown in FIG. 16, the upper part (a) and the lower part (b) overlap each other at the line X–X', that is, the channel part of the load transistor is positioned on the gate part of the driver transistor, so that the laminated part forms a capacitor construction which generates a desired capacitance C.

EXAMPLE 2

Figure 8:
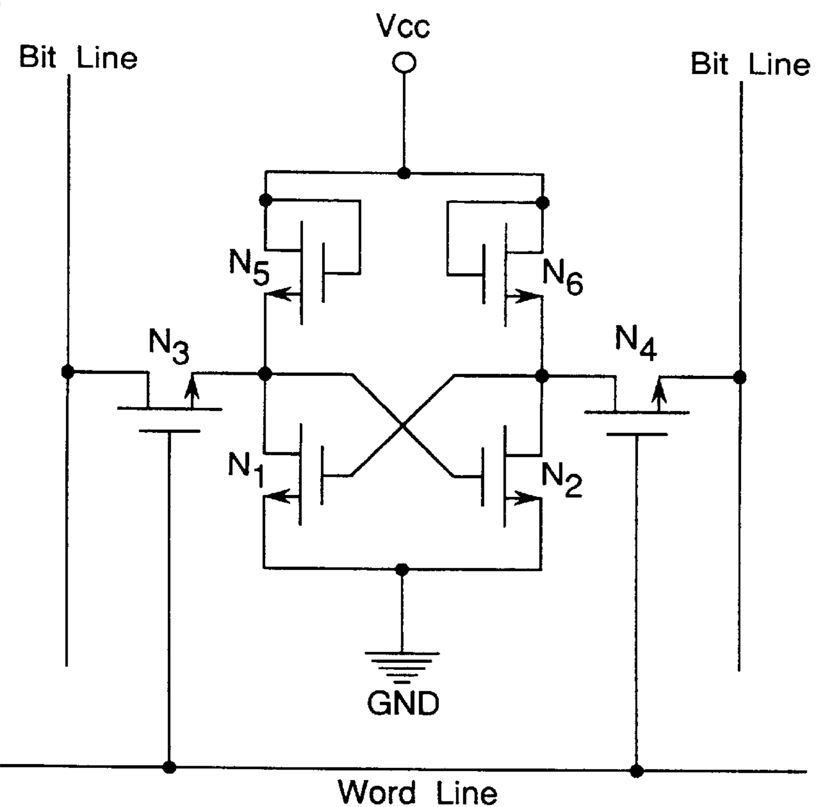
FIG. 8 is an equivalent view showing the embodiment of normally ON type SRAM memory cell according to Example 2.

While connection of the driver transistor N1 or N2 and the load transistor N5 or N6 in EXAMPLE 1 is a cross couple type as shown in FIG. 1, their connection designed to be a normally ON type as shown in FIG. 8, wherein the load N-ch transistors N5 and N6 act as a resistor. The other processes are carried out in a same way as EXAMPLE 1.

EXAMPLE 3

Figure 9:
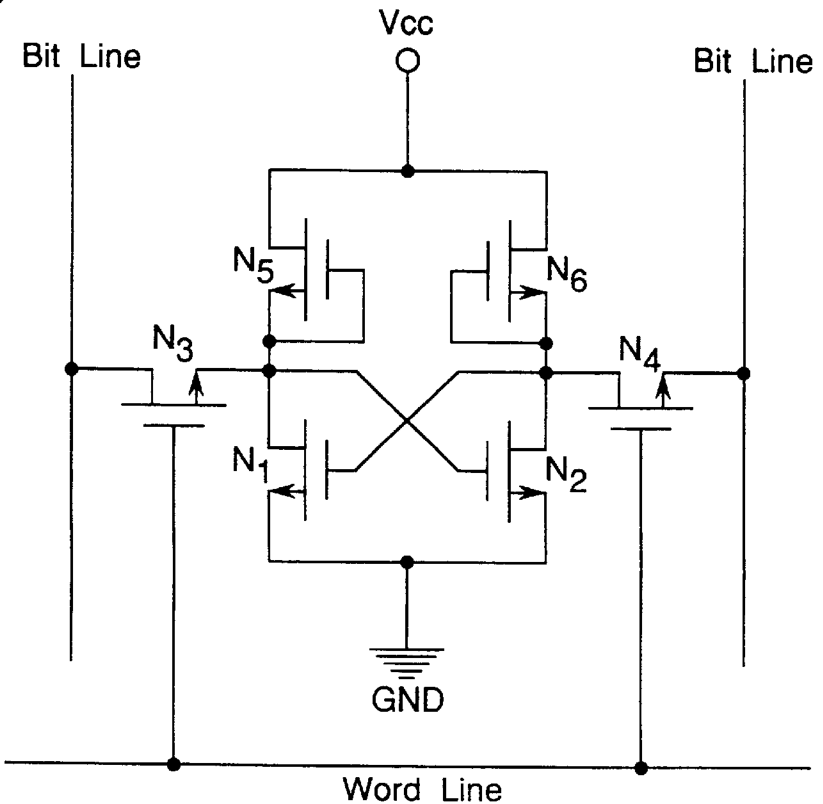
FIG. 9 is an equivalent view showing the embodiment of normally OFF type SRAM memory cell according to Example 2.
Figure 10:
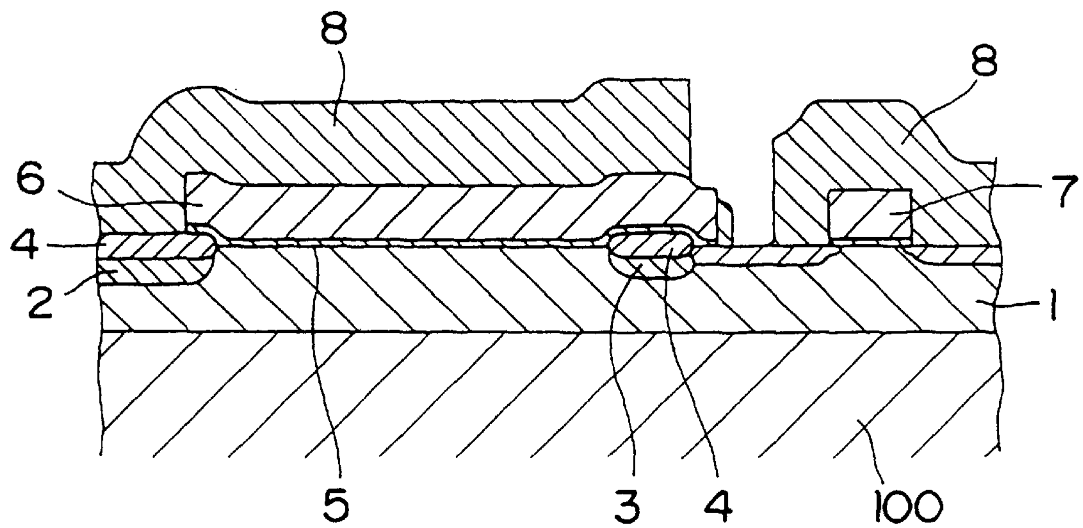
FIG. 10 is a sectional view showing one step of Example 4.
Figure 11:
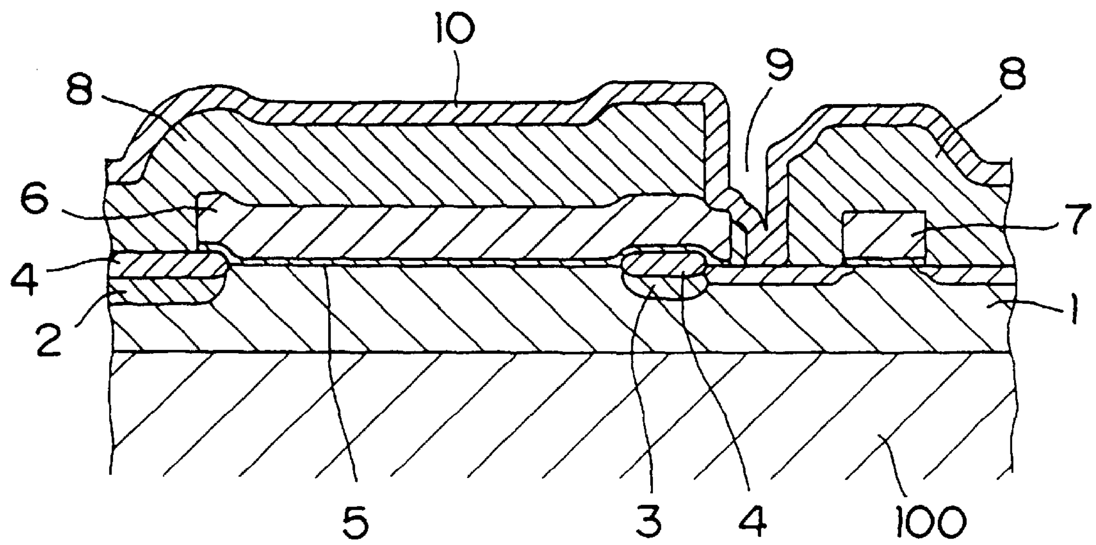
FIG. 11 is a sectional view showing one step of Example 4.
Figure 12:
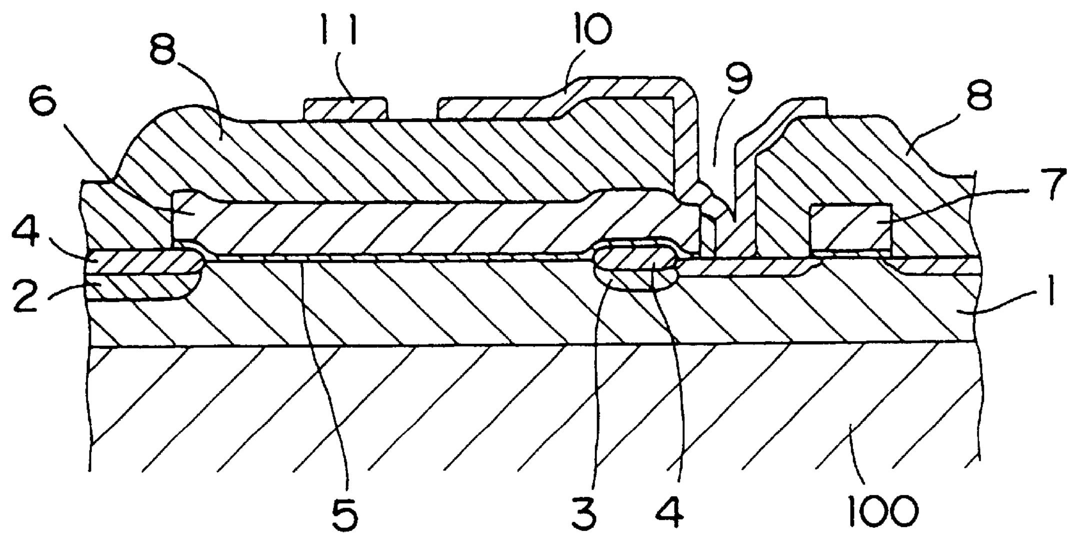
FIG. 12 is a sectional view showing one step of Example 4.
Figure 13:
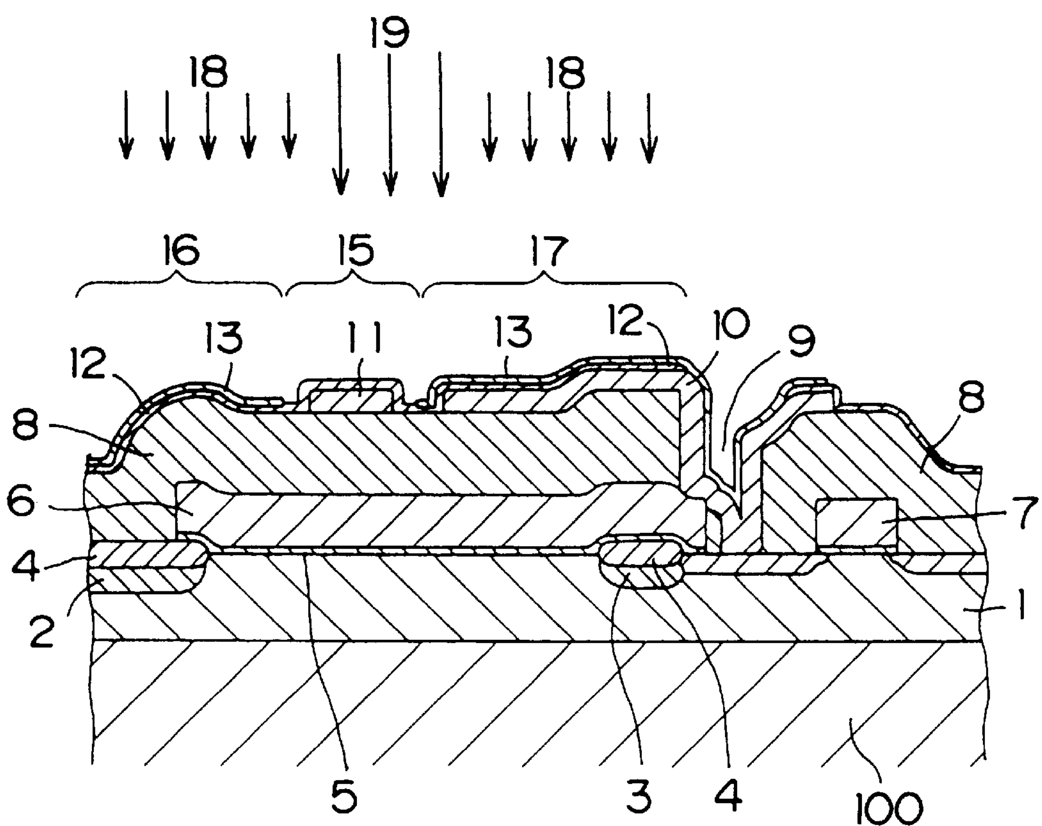
FIG. 13 is a sectional view showing one step of Example 4.

As shown in FIG. 9, connection of the driver transistor N1 or N2 and the load transistor N5 or N6 is designed to be a normally OFF type, wherein the load N-ch transistors N5 and N6 act as an ultra-high resistor. The other processes are carried out in a same way as EXAMPLE 1.

In SRAM memory cell, especially low power consumption type, it is important how to decrease leak current as possible, which significantly affects the memory performance. According to the present invention, design of setting the threshold voltage Vth larger than an absolute value of the source voltage Vcc can make the load transistors N5 and N6 to be in a state of normally OFF and to act as a n ultra-high resistor.

In this case, there is obtained a resistance as high as several T $(10^{12})\Omega$ or more which has not been obtained by means of the conventional thin film polysilicon resistor. Thereby, when the driver transistor is in a state of ON, a current consumption volume decreases to about one-tenth compared with the conventional one and it is possible to realize low power consumption of SRAM.

EXAMPLE 4

This example is carried out in a same way as EXAMPLE 3 except adding an implanting process of the P-type ion 19 in order to increase the threshold voltage of the load N-ch transistor.

FIGS. 10 to 13 show the additional step which is carried out after the steps carried out in EXAMPLE 3. That is, the resultant source region 16 and drain region 17 are masked by a photosensitive resin (not shown) and the gate region 15 is subjected to the P type implantation.

EXAMPLE 5

This example is carried out by a same way as EXAMPLE 4 except the P type ion implantation is carried out by means of $BF_2$. That is, the ion implantation is carried out by implanting F with the P type ion at the same time, by which unpaired electron of Si in the substrate is terminated, resulting in depressing the threshold voltage change with time (−BT(Bias and Temperature) shift) and improvement of reliance of SRAM.

Figure 14:
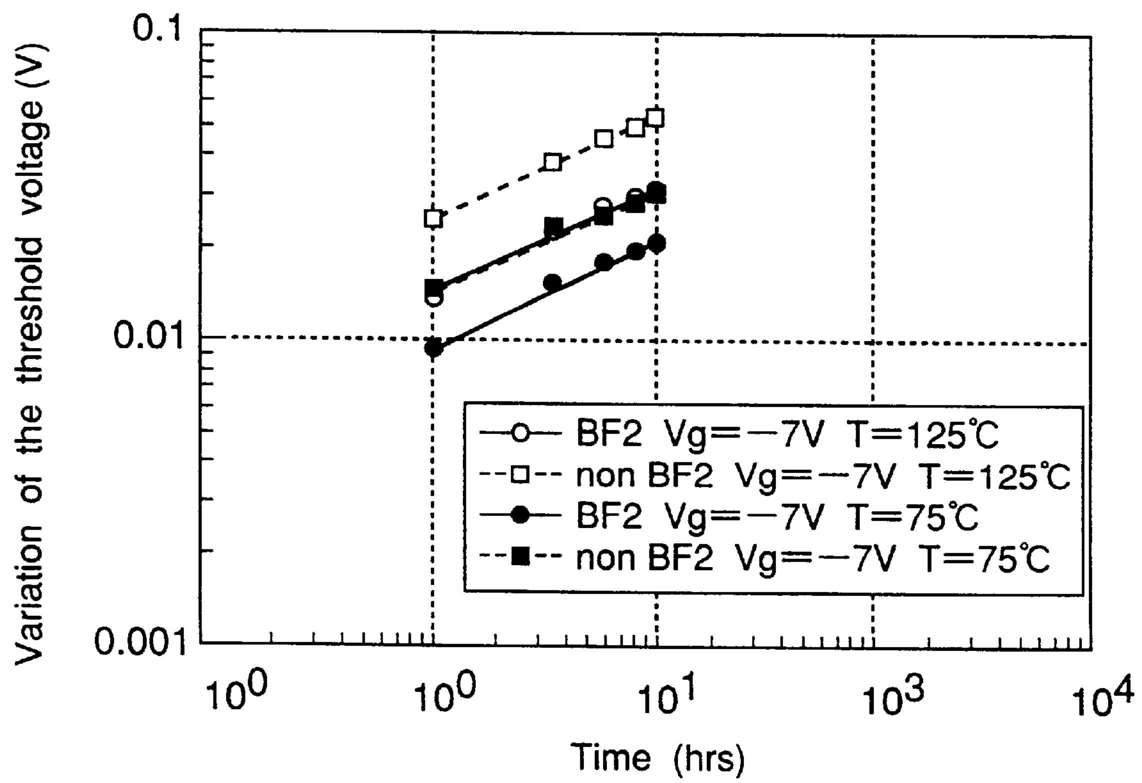
FIG. 14 is a graph showing −BT(Bias and Temperature) stress test result of TFT.
Figure 15:
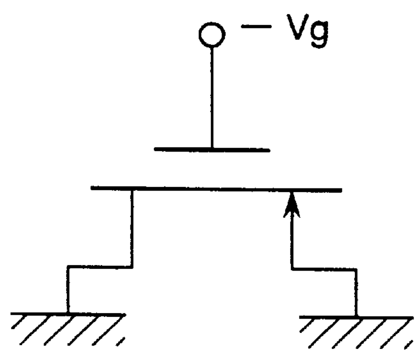
FIG. 15 is a equivalent circuit showing a voltage applied state of −BT test, FIG. 16(*a*) is a plane view showing a lower layer lamination construction of SRAM memory cell manufactured according to the present invention, FIG. 16(*b*) is a plane view showing an upper plane view of SRAM memory cell manufactured according to the present invention.

FIG. 14 shows a result of −BT stress test which is an investigation of the threshold voltage change with time under applying a negative gate voltage to the gate electrode of transistor as shown in FIG. 15. In FIG. 14, $BF_2$ indicates the case of implanting $BF_2$ (for example, $1\times10\ cm^{-2}$) while non-$BF_2$ indicates the case of not implanting $BF_2$. Vg indicates a gate voltage(−7V) and T indicates a test temperature (125° C. and 75° C.).

Apparent from FIG. 14, it is understood that implantation of $BF_2$ into the channel part of the load N-ch transistor can make the threshold voltage change with time depressed. However, such an effect can not be obtained by means of implanting only B(boron). Therefore, it is believed that such an effect can be obtained by means of Fluorine function.

EXAMPLE 6

Such an effect by means of implanting $BF_2$ into the channel part of the load transistor as proved in EXAMPLE 5 can be applied to a SRAM memory cell comprises the N-ch balk transistors and the P-ch load transistors.

Figure 19:
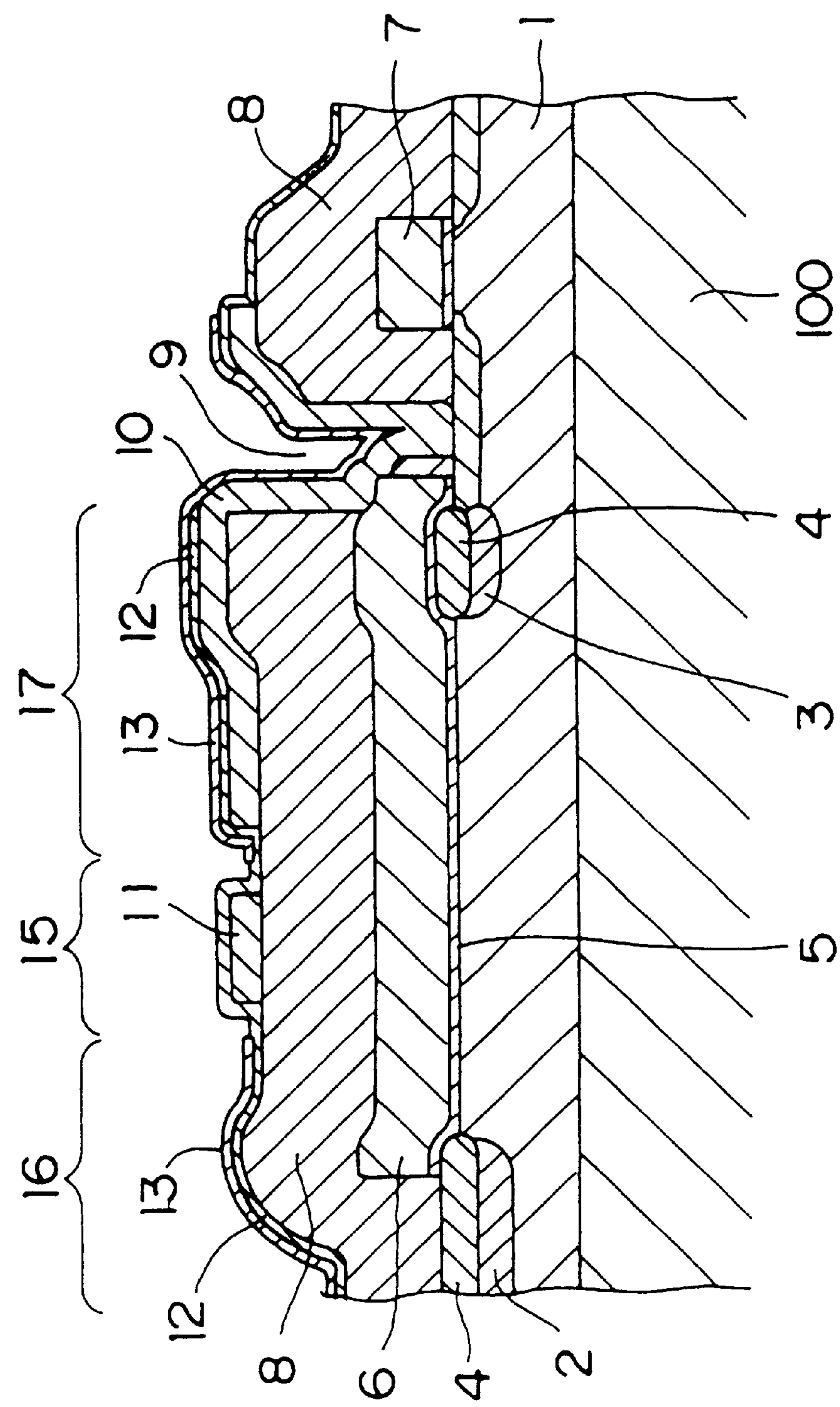
FIG. 19 is a sectional view of the embodiment according to Example 6.

A CMOS type SRAM memory cell as shown in FIG. 19 is called as “Bottom gate type”. FIGS. 20 to 23 show the steps of manufacturing the bottom gate type memory cell, In the figures, same parts and elements as that in FIGS. 3 to 7 are indicated by same numerals.

Figure 20:
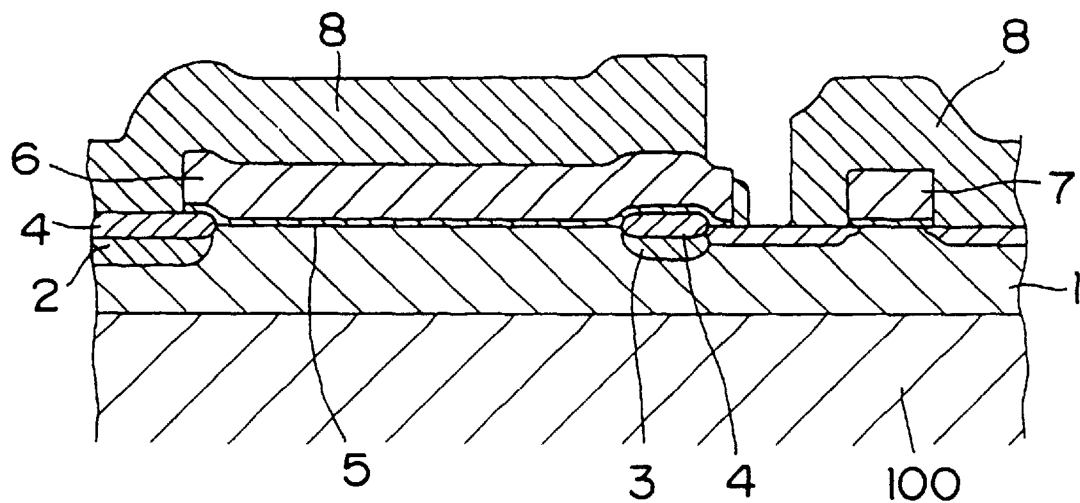
FIG. 20 is a sectional view showing one step of Example 6.

As shown in FIG. 20, N-ch balk transistors are formed on a substrate and thereafter on the balk transistors an insulate layer 8, for example having a thickness of about 1000 Å, is formed. On the insulate layer, there is formed an opening corresponding to gate electrodes of the balk transistors.

Figure 21:
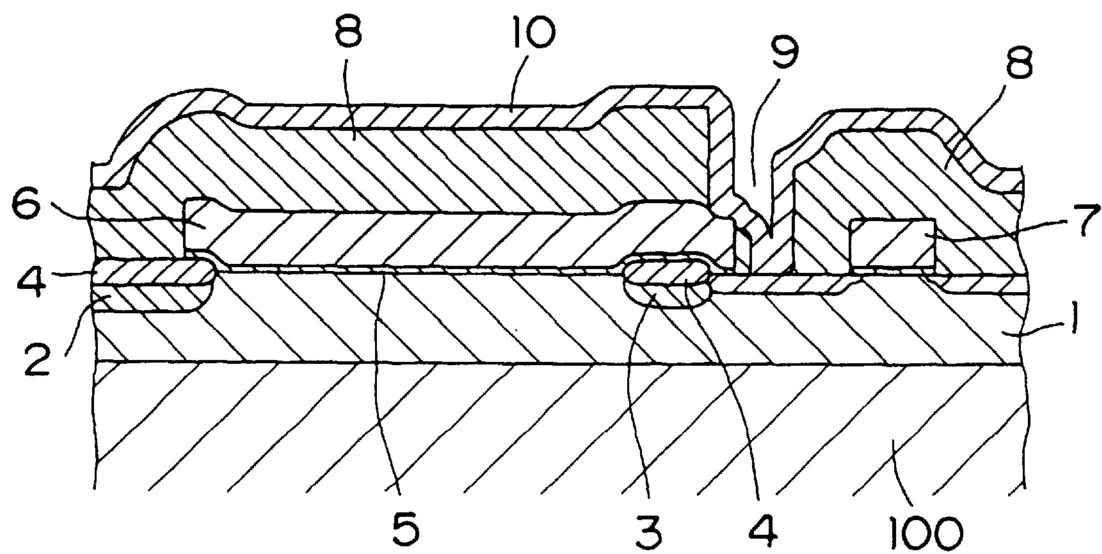
FIG. 21 is a sectional view showing one step of Example 6.
Figure 22:
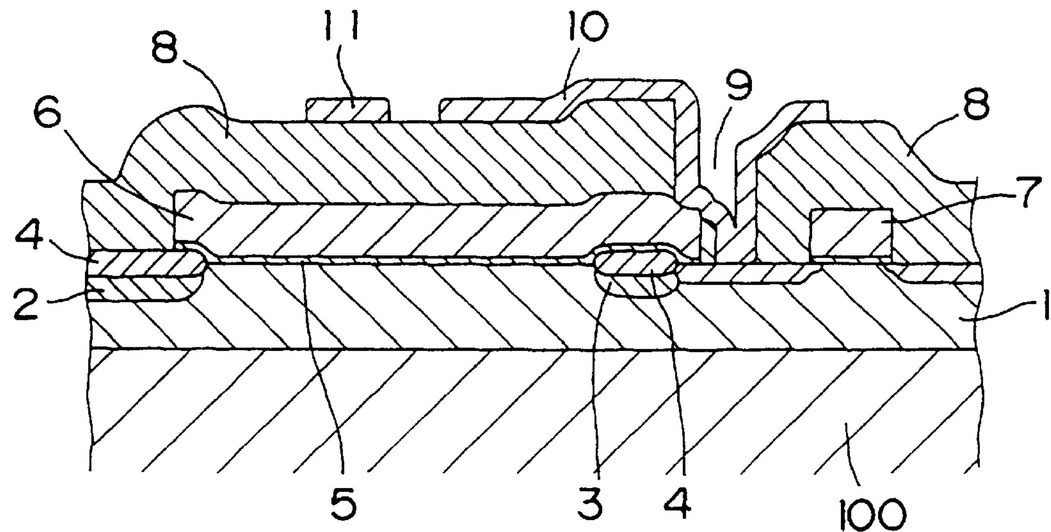
FIG. 22 is a sectional view showing one step of Example 6.
Figure 23:
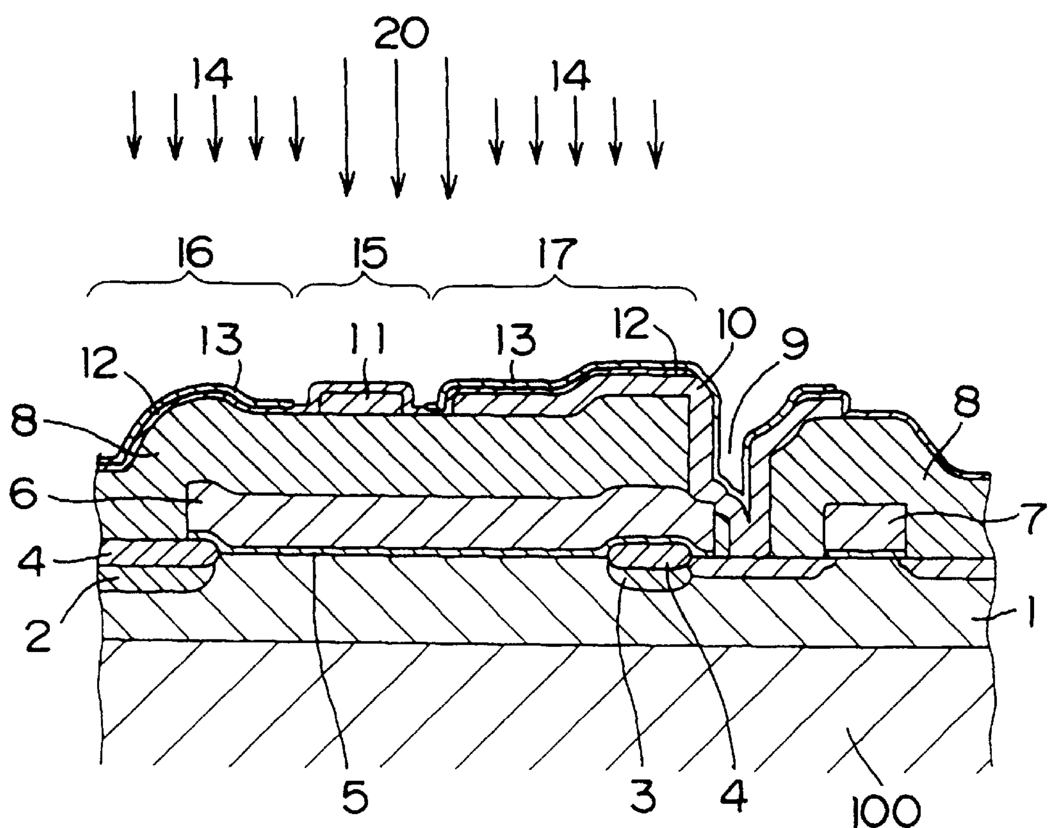
FIG. 23 is a sectional view showing one step of Example 6.
Figure 24:
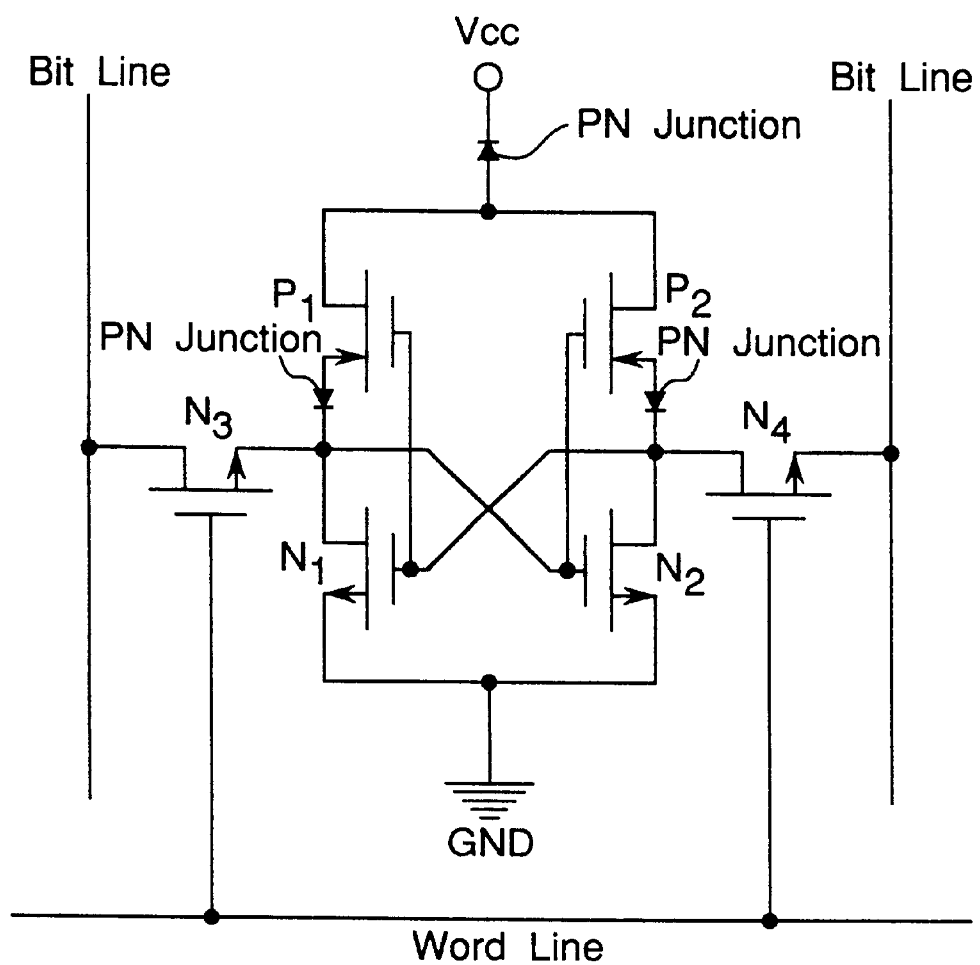
FIG. 24 is an equivalent view of the conventional SRAM memory cell with considering PN junctions.

Secondly, as shown in FIG. 21, a polysilicon layer 10, for example having a thickness of 500 Å is formed to connect the lower balk transistors and the load transistors through a contact part 9 and then is subjected to a patterning treatment to form a gate electrode 11 of the load transistor as shown in FIG. 22.

Thirdly, after forming a gate oxide layer 12 having a thickness of several 100 Å, a polysilicon layer 13 having a thickness of several 100 Å is formed thereon.

Fourthly, after subjecting polysilicon layer 13 to a patterning treatment, the P type ion 16 is implanted into a source and a drain through a mask of photosensitive resin (not figured) to form a P type source region and a P type drain region 17 which constitute bottom gate type P-ch transistor to be the load part of the memory cell.

Finally. the resultant source region 16 and drain region 17 are masked by a photosensitive resin (not shown) and the gate region 15 is subjected to implantation of $BF_2$, which can make the threshold voltage change of the load transistor with time depressed.

What is claimed is:

1. SRAM memory cells provided with a balk transistor part comprising N-channel type access transistors and driver transistors and a P-channel type load part, wherein the load part is a thin film transistor into which P-channel part the P type dopant is implanted or driven by $BF_2$, and the thin film transistor is formed above the balk transistor part.

2. SRAM memory as claimed in claim 1, wherein a gate electrode of the thin film transistor is formed above the gate electrode of the balk transistor.

3. SRAM memory cells as claimed in claim 1, wherein an insulating layer is formed between the thin film transistor and the balk transistor.

* * * * *